(12) United States Patent
Wang et al.

(10) Patent No.: US 12,385,140 B2
(45) Date of Patent: *Aug. 12, 2025

(54) METHOD FOR UNIFORM GROWTH OF BI-LAYER TRANSITION METAL DICHALCOGENIDE CONTINUOUS FILMS

(71) Applicant: NANJING UNIVERSITY, Nanjing (CN)

(72) Inventors: Xinran Wang, Nanjing (CN); Lei Liu, Nanjing (CN); Taotao Li, Nanjing (CN); Yi Shi, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 320 days.

This patent is subject to a terminal disclaimer.

(21) Appl. No.: 17/724,949

(22) Filed: Apr. 20, 2022

(65) Prior Publication Data

US 2022/0243335 A1    Aug. 4, 2022

(30) Foreign Application Priority Data

Feb. 25, 2022   (CN) .......................... 202210182597.0

(51) Int. Cl.
*C23C 16/52*   (2006.01)
*C23C 16/02*   (2006.01)
*C23C 16/30*   (2006.01)

(52) U.S. Cl.
CPC .......... *C23C 16/52* (2013.01); *C23C 16/0209* (2013.01); *C23C 16/305* (2013.01)

(58) Field of Classification Search
None
See application file for complete search history.

(56) References Cited

U.S. PATENT DOCUMENTS

2020/0385888 A1* 12/2020 Wang .................... C30B 25/186

FOREIGN PATENT DOCUMENTS

WO    WO-2021248089 A1 * 12/2021 ............. C01G 39/06

* cited by examiner

*Primary Examiner* — Kim S. Horger
(74) *Attorney, Agent, or Firm* — JCIPRNET

(57) ABSTRACT

A large-area, uniform, and continuous films of bi-layer transition metal dichalcogenide (TMDC) and preparation method comprises that the bi-layer TMDC continuous films are grown on a substrate through the merging of bi-layer domains; the top and bottom layers of the bi-layer domains have equal size and grow synchronously, which guarantees uniformity of the bi-layer films; the bi-layer domains were nucleated at the surface steps of the substrate which require a height no less than 0.8 nm; the bi-layer TMDCs films include molybdenum disulfide, tungsten disulfide, molybdenum diselenide, and tungsten diselenide, and the size of the bi-layer TMDC films reaches centimeter-level and above, limited only by the substrate size.

4 Claims, 5 Drawing Sheets

METHOD FOR UNIFORM GROWTH OF BI-LAYER TRANSITION METAL DICHALCOGENIDE CONTINUOUS FILMS

CROSS REFERENCES

This application claims foreign priority benefits the prior Chinese application number CN202210182597.0 filed on 25 Feb. 2022.

TECHNOLOGY FIELD

The invention relates to large-area, uniform, and continuous bi-layer TMDC films, and the preparation methods.

BACKGROUND ART

Two-dimensional semiconductors, such as transition metal dichalcogenides have an atomic-level thickness, dangling-bonds-free surface, and intriguing electrical properties, enabling the great potential for future high-performance, low-power-consumption logic devices and integrated circuits in the post-Moore era. The controllable preparation of large-area, uniform, and continuous TMDC films is of the first importance.

At present, monolayer TMDC films have been well developed and demonstrated outstanding but not yet on-target performance. Fortunately, bi-layer TMDCs were predicted to have overwhelming overall performances beyond their mono-layer counterparts, such as higher mobility, higher on-state current density due to smaller bandgap, and higher density of states. However, the preparation of uniform bi-layer TMDC films has not been realized yet so far.

Until now, only isolated bi-layer TMDC domains have been realized via a layer-by-layer mode, in which the smaller top layers are subsequently deposited on the already existing larger bottom layers, forming non-edge-aligned bi-layer TMDC domains (Nature Communications, 2019, 10, 598). This strategy can obtain discontinuous domains of bi-layer TMDC, but hard to get bi-layer films with uniformity and continuity. Therefore, developing large-area, uniform, and continuous bi-layer TMDC films, is currently facing tough technical challenges.

SUMMARY OF THE INVENTION

Purpose of the invention: The present invention provides large-area, uniform, and continuous bi-layer TMDC films in view of the problems of thickness non-uniformity and lateral non-continuity of the bi-layer TMDC in the current technology. And it gives a large-area preparation method for the above-mentioned uniform and continuous bi-layer TMDC films.

Technical scheme: the uniform, continuous films of bi-layer TMDC are epitaxially grown on a sapphire substrate by the coalescence of bi-layer TMDC domains. The sapphire substrate contains high surface steps with the height no less than 0.8 nm. The top and bottom layers of the domains synchronously nucleate at the high steps of the substrate and have equal size and aligned edges. The lateral dimension of the coalescent films reaches the centimeter level and above.

Preferably, TMDCs represent molybdenum disulfide, tungsten disulfide, molybdenum diselenide, or tungsten diselenide.

Preferably, the substrate is sapphire, on which 4 or more layers of Al—O—Al steps (~0.8 nm) are required. And 6 steps with 1.3 nm height are the best.

Preferably, the miscut angle of the sapphire wafer is 0.2-10°.

Preferably, the method for preparing uniform and continuous bi-layer TMDC films of the present invention includes a vapor deposition technique. A sapphire substrate is placed in a vapor deposition chamber at elevated temperatures, then gaseous sources are loaded into to trigger the material growth. Two overlapping layers of aligned TMDC domains appear on the surface of the sapphire substrate and gradually grow large with the source continuously feeding. Finally, they merge into large-area uniform bi-layer TMDC continuous films.

Principle of the present innovation: Layer-by-layer growth of bi-layer TMDC is thermodynamically unfavorable since the increased edge length of the top layer leads to an energy increase of the entire system. Therefore, the top layers in the layer-by-layer growth mode are difficult to merge, failing to control the thickness uniformity and in-plane continuity. In the present invention, top and bottom layers synchronously grow, the increase in edge energy due to domain growth is offset by the decrease in surface energy. Domain nucleation, growth and coalesce into bi-layer continuous films are thermodynamically favorable. Utilizing the bi-layer aligned domains directly formed on the surface of the substrate to maintain the synchronous growth of the two layers, the invention obtain large-area uniform bi-layer continuous films.

Beneficial effects: Compared with the existing materials and prior method, the present invention has the following significant advantages:

(1) The present invention achieves the epitaxial growth of large-area, uniform, continuous bi-layer TMDC films;
(2) The bi-layer TMDC continuous films meet the requirements of high-performance electronic device integration since the size reaches the centimeter level and above, which is limited only by the substrate size and the chamber volume;
(3) The present invention utilizes the atomic steps on the sapphire surface, which can be obtained by miscutting and annealing the substrate. The process is simple, possesses strong designability, great stability, and high repeatability. In addition, it is easy to realize industrial enlargement.

DETAILED DESCRIPTION OF THE INVENTION

The technical solutions of the present invention will be further described below with reference to the accompanying drawings.

The preparation of large-area uniform bi-layer TMDC include molybdenum disulfide (MoS$_2$), tungsten disulfide (WS$_2$), molybdenum diselenide (MoSe$_2$), tungsten diselenide (WSe$_2$), etc. During the growth, the up and bottom layers grow synchronously, perfectly merge, and obtain the large-area bi-layer continuous films finally.

Example 1

To clarify the characteristics of bi-layer MoS$_2$ grown by means of the method in this invention, bi-layer MoS$_2$ domains were grown in this example. The sulfur powder (S), metal molybdenum (Mo), and sapphire (C surface, with 1° miscutted angle, annealed in the air) substrates were placed in the first, second, and third temperature zones of the three-temperature zone CVD system, respectively. The pressure of chamber was pumped below 10 Pa, and fed 100 standard milliliters per minute (sccm) of Ar. Mo, S and substrate were heated to 180° C., 850° C. and 1080° C., respectively. Once all temperature arrive at their set value, 10 sccm O$_2$ was induced to start the reaction. O$_2$ was turned off after 10 min of reaction. When the temperature of substrate was cooled to 300° C. in an atmosphere with Ar and S, the S heating device was turned off. Cool down to room temperature and remove the sample finally.

Figure 1:
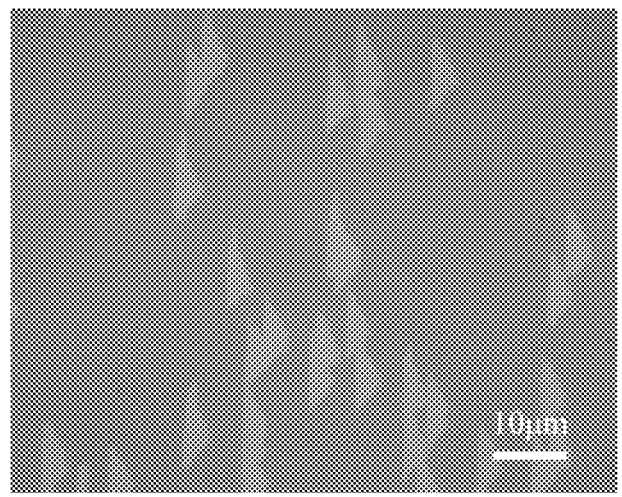
FIG. 1 is an optical micrograph of uniformly distributed bi-layer $MoS_2$ domains in Example 1.

Its optical micrograph is shown in FIG. 1, and it could be seen that bi-layer MoS$_2$ triangular domains with uniform thickness are obtained by using a substrate with high steps of the present invention.

Figure 2:
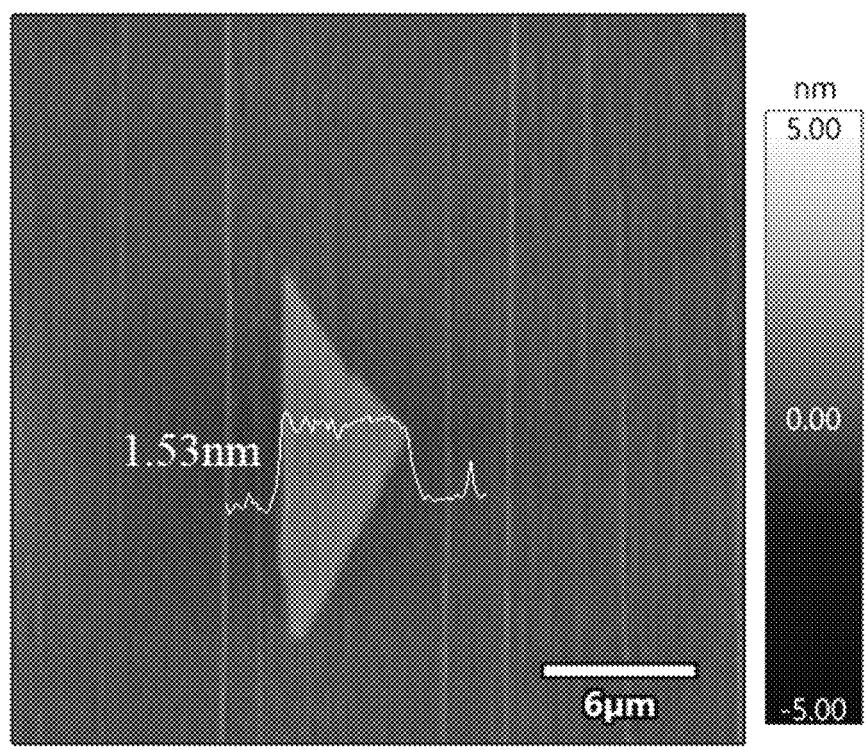
FIG. 2 is an atomic force microscope (AFM) image of bi-layer $MoS_2$ domains in Example 1.

Referring to FIG. 2, the height of MoS$_2$ domains grown on sapphire was measured by atomic force microscope (AFM), indicating that the obtained MoS$_2$ was bi-layer.

Figure 3:
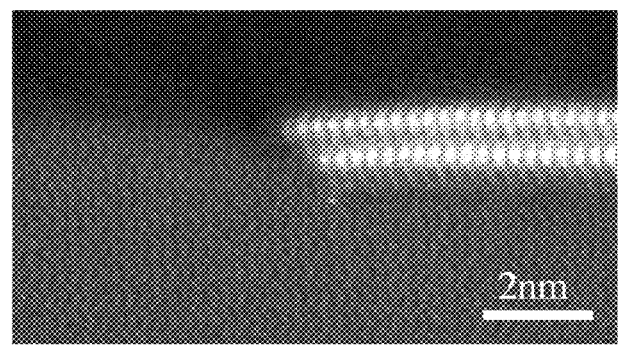
FIG. 3 is a cross-sectional transmission electron microscope image showing the high-step-induced nucleation of bi-layer $MoS_2$ domains on sapphire in Example 1.
Figure 4:
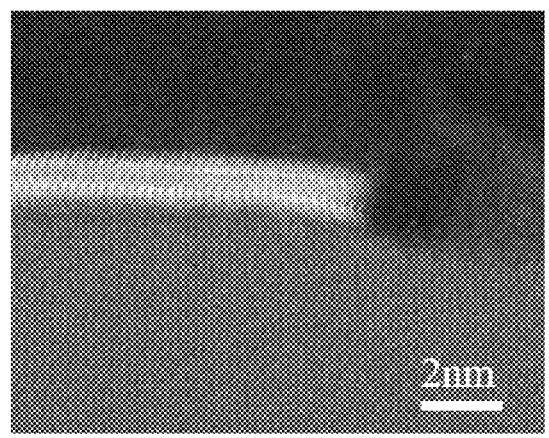
FIG. 4 is a cross-sectional transmission electron microscope image of the front end of the bi-layer molybdenum disulfide grain growth in Example 1, and it could be seen that the upper and lower layers are grown in alignment.

In the early stage of nucleation of bi-layer domains, high-resolution imaging of the cross-section is performed. FIGS. 3-4 show the high-resolution transmission electron microscope characterization of the cross-section of the sample. It displays that the bi-layer domains rely on high-step nucleation, which verifies the principle that high steps induce bi-layer nucleation is observed, and bi-layer domains show the alignment of atoms of the upper and lower layers.

Example 2

Bi-layer MoS$_2$ films could be obtained by direct bi-layer nucleation in the example, demonstrating feasibility of growing large area films. Put S powder, metal Mo, and a sapphire substrate with a length and width of about 2 cm (C surface, with 1° miscutted angle, annealed in the air) into the first, second and third temperature zones of three-temperature zone CVD system, respectively. The pressure of chamber was pumped below 10 Pa, and fed 100 sccm of Ar. Mo, S and substrate were heated to 180° C., 850° C. and 1080° C., respectively. Once all temperature arrive at their set value, 10 sccm O$_2$ was induced to start the reaction. O$_2$ was turned off after 30 min of reaction. When the temperature of substrate was cooled to 300° C. in an atmosphere with Ar and S, the S heating device was turned off. Cool down to room temperature and remove the sample finally.

Figure 5:
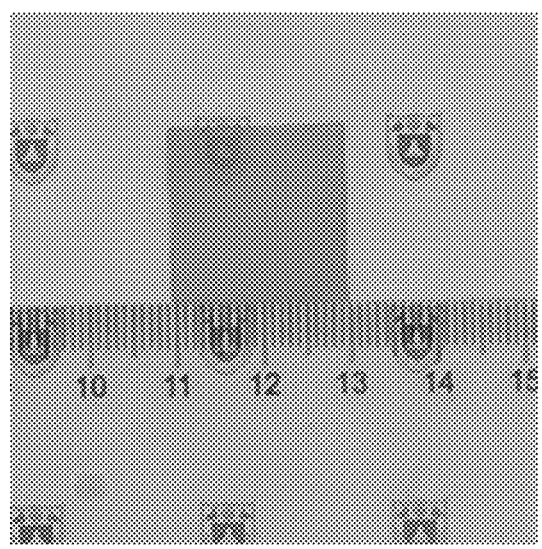
FIG. 5 is a photograph of centimeter-level bi-layer $MoS_2$ continuous film which is obtained in Example 2.
Figure 6:
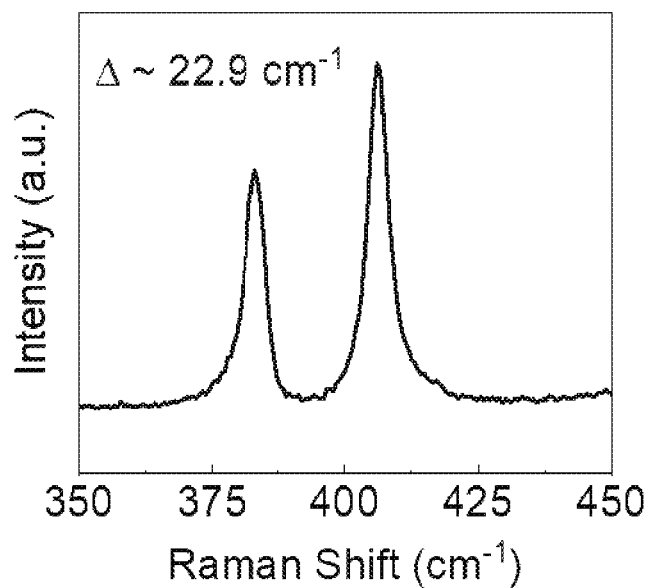
FIG. 6 is the Raman spectra of the bi-layer $MoS_2$ grown in Example 2.

The bi-layer MoS$_2$ prepared by the present invention can reach the length level of centimeters. The photo of the 2 cm bi-layer sample is shown in FIG. 5, and FIG. 6 is the Raman spectra of the bi-layer sample. FIG. 6 displays that the wavenumber difference of two Raman characteristic peaks is ~22.9 cm-1, which is larger than the wavenumber difference of the characteristic peak of the monolayer, which further proves that the prepared sample is MoS$_2$ with a bi-layer.

Example 3

The example gives growth results of substrate with larger miscutted angle. The S powder, metal Mo, and sapphire (C surface, with 4° miscutted angle, annealed in the air) substrates were placed in the first, second, and third temperature zones of the three-temperature zone CVD system, respectively. The pressure of chamber was pumped below 10 Pa, and fed 100 standard milliliters per minute (sccm) of Ar. Mo, S and substrate were heated to 180° C., 850° C. and 1080° C., respectively. Once all temperature arrive at their set value, 10 sccm O$_2$ was induced to start the reaction. O$_2$ was turned off after 10 min of reaction. When the temperature of substrate was cooled to 300° C. in an atmosphere with Ar and S, the S heating device was turned off. Cool down to room temperature and remove the sample finally.

Figure 7:
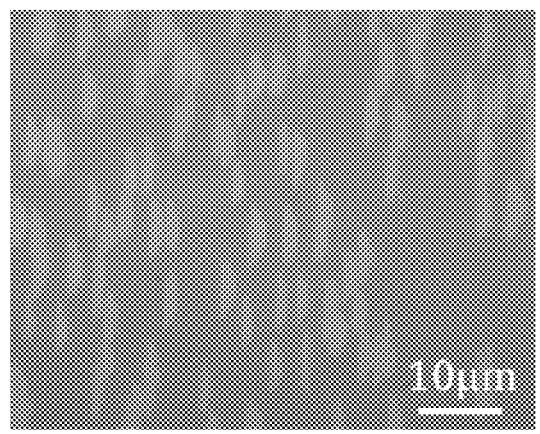
FIG. 7 is an optical micrograph of uniformly distributed bi-layer $MoS_2$ domains on sapphire with 4° miscutted angle.

At the same annealing condition, step height increase with the miscutted angle. So sapphire with 4° miscutted angle has higher step height. FIG. 7 is optical micrograph of uniform bi-layer domains grown on sapphire with 4° miscutted angle, demonstrating that different miscutted angle can grow bi-layer MoS$_2$ as well.

Example 4

To account for universality of other bi-layer TMDCs, uniform bi-layer WS$_2$ domains were grown in the example. Put S powder, tungsten trioxide (WO$_3$), and sapphire substrate (C surface, with 1° miscutted angle, annealed in the air) into the first, second, and third temperature zones of the three-temperature zone CVD system, respectively. The pressure of chamber was pumped below 10 Pa and fed 100 sccm Ar. WO$_3$, S and substrate were heated to 180° C., 850° C., and 1080° C., respectively. All temperature arrive at their set value, 10 sccm H$_2$ was induced to start the reaction. After 10 min of reaction, H$_2$ was turned off. When the temperature of substrate was cooled to 300° C. in an Ar and S atmosphere, and the S heating device was turned off. Then continue to cool down to room temperature, take out the sample, and obtain uniformly distributed bi-layer WS$_2$ domains.

Figure 8:
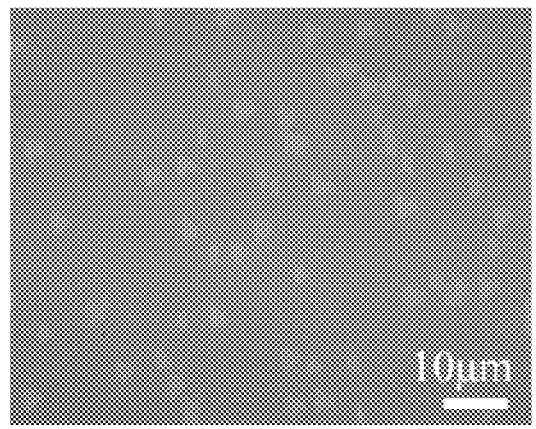
FIG. 8 is the microscope photograph of uniformly distributed bi-layer $WS_2$ domains in Example 4.

The optical micrograph is shown in FIG. 8, and it can be seen that bi-layer WS$_2$ triangular domains with uniform thickness are obtained by using a substrate with high steps of the present invention.

Figure 9:
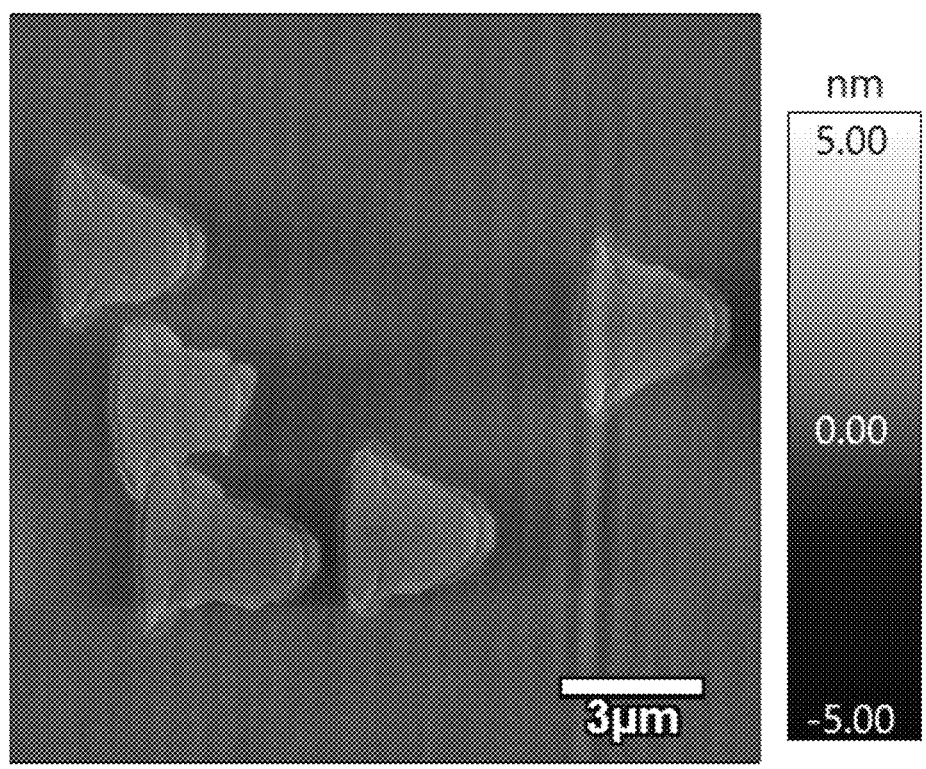
FIG. 9 is an AFM image of bi-layer $WS_2$ domains in Example 4.
Figure 10:
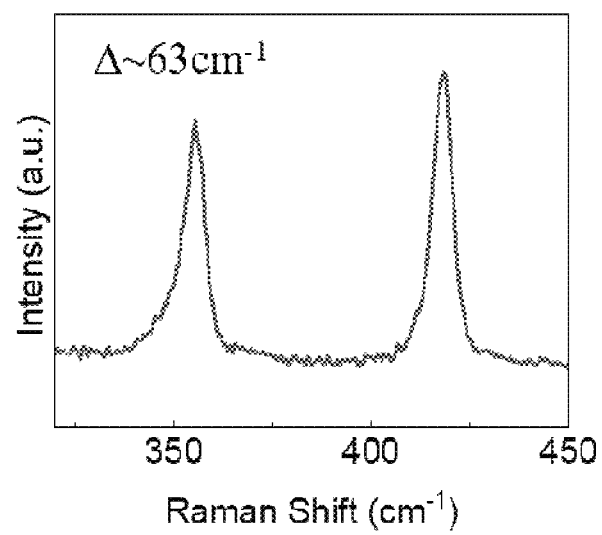
FIG. 10 is the Raman spectra of bi-layer WS$_2$ grown in Example 4.

As shown in FIG. 9, AFM is used to measure the height of WS$_2$ domain grown on sapphire, indicating that the obtained WS$_2$ was bi-layer, and the obtained bi-layer WS$_2$ has the same size of the upper and lower layers, indicating its aligned nucleation characteristics. FIG. 10 shows the Raman spectra of the bi-layer sample. The wavenumber difference between the two Raman characteristic peaks is ~63 cm$^{-1}$, which is larger than the wavenumber difference of the monolayer Raman characteristic peak which further proves that the prepared sample is bi-layer WS$_2$.

Figure 11:
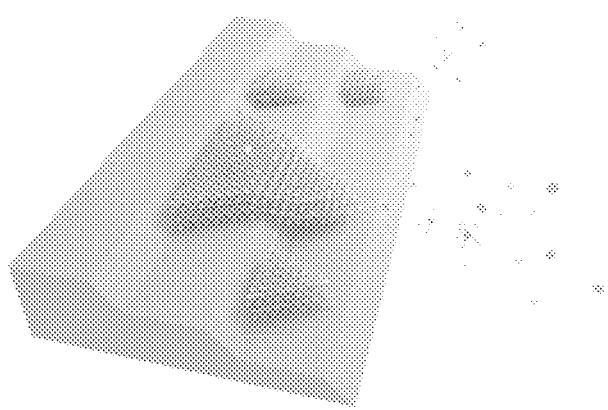
FIG. 11 is a schematic of bi-layer TMDC nucleation and growth at the high steps in the present invention.

The invention adopts the vapor deposition method to form bi-layer crystal domains on the surface of the substrate, the upper and lower layers of the bi-layer crystal domains are aligned and grown at an equal speed, and coalesced into uniform and continuous bi-layer films; upper and lower edge-aligned bi-layer TMDC domains with uniform thickness is directly generated on the surface of the sapphire substrate, by simulation calculation, the top layer has higher edge energy than the bottom layer, which is thermodynamically stable during the growth process and can exist stably. With the increase of the reaction time, the bi-layer domains absorb adatoms simultaneously at the edges of the upper and lower layers to grow, and finally, large-area and uniform bi-layer TMDC continuous films are obtained by merging. FIG. 11 exhibits a schematic of bi-layer TMDC nucleation and growth at the high steps.

The process of preparing the above-mentioned bi-layer TMDC crystal by chemical vapor deposition method is as follows: the sapphire single crystal substrate is placed in the downstream area of a chemical vapor deposition chamber, and precursors including chalcogen elements and transition metal elements are placed in the upstream area, respectively. The reaction conditions of the growth source are set to generate bi-layer TMDC domains with a single epitaxial relationship on the surface of the sapphire single crystal substrate; bilayer domains grow up gradually and merge to obtain large-area bi-layer TMDC films.

What is claimed is:

1. A bi-layer transition metal dichalcogenide (TMDC) continuous film comprising a substrate and a bi-layered crystal grain comprising top and bottom layers of domains synchronously nucleated on a surface of the substrate; wherein the substrate contains high surface steps with a height no less than 0.8 nm; the top and bottom layers at the high surface steps of the substrate have equal size, equal growth speed, and aligned edges; a lateral dimension of the bi-layer TMDC continuous film reaches a centimeter level or above.

2. The bi-layer transition metal dichalcogenide continuous film according to claim 1, wherein TMDC in the bi-layer TMDC continuous film is molybdenum disulfide, tungsten disulfide, molybdenum diselenide or tungsten diselenide.

3. The bi-layer transition metal dichalcogenide continuous film according to claim 1, wherein the substrate is sapphire, and four or more layers of Al—O—Al atomic steps are required and distributed on the surface; the height atomic step of the sapphire is equal to or more than 0.8 nm.

4. The bi-layer transition metal dichalcogenide continuous film according to claim 3, wherein miscut angle of the sapphire substrate is 0.2-10°.

* * * * *